(12) United States Patent
Sasada

(10) Patent No.: US 6,841,030 B2
(45) Date of Patent: Jan. 11, 2005

(54) ELECTRONIC COMPONENT HANDLING APPARATUS AND ELECTRONIC COMPONENT HANDLING METHOD

(75) Inventor: Kazuya Sasada, Sabae (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 8 days.

(21) Appl. No.: 10/230,052

(22) Filed: Aug. 29, 2002

(65) Prior Publication Data

US 2003/0041960 A1 Mar. 6, 2003

(30) Foreign Application Priority Data

Aug. 31, 2001 (JP) ........................................ 2001-263833

(51) Int. Cl.[7] .............................................. B32B 35/00
(52) U.S. Cl. ...................... 156/344; 156/584; 438/464; 438/976
(58) Field of Search ................................ 156/344, 584; 438/464, 976

(56) References Cited

U.S. PATENT DOCUMENTS

| | | | | |
|---|---|---|---|---|
| 4,855,012 A | * | 8/1989 | Sumi ........................... | 156/584 |
| 5,022,951 A | * | 6/1991 | Behlmer et al. ............ | 156/379 |
| 5,091,042 A | * | 2/1992 | Bruckner ..................... | 156/584 |
| 5,368,678 A | * | 11/1994 | Miyamoto et al. ........ | 156/405.1 |
| 5,383,997 A | | 1/1995 | Minowa et al. | |
| 5,571,594 A | | 11/1996 | Minowa et al. | |
| 5,608,487 A | * | 3/1997 | Pierce et al. ................. | 396/564 |
| 5,622,585 A | | 4/1997 | Minowa et al. | |
| 5,696,327 A | * | 12/1997 | Huang et al. ................. | 73/845 |
| 6,227,276 B1 | * | 5/2001 | Kim et al. .................... | 156/584 |
| 6,337,258 B1 | * | 1/2002 | Nakayoshi et al. ......... | 438/464 |
| 6,478,918 B2 | * | 11/2002 | Bennett et al. ............. | 156/248 |
| 6,569,259 B1 | * | 5/2003 | Kagawa ....................... | 134/37 |
| 6,680,241 B2 | * | 1/2004 | Okamoto et al. ........... | 438/464 |

FOREIGN PATENT DOCUMENTS

| | | |
|---|---|---|
| JP | 4-291712 | 10/1992 |
| JP | 2000-340528 | * 12/2000 |

* cited by examiner

*Primary Examiner*—Mark A. Osele
(74) *Attorney, Agent, or Firm*—Burns, Doane, Swecker & Mathis, L.L.P.

(57) ABSTRACT

An electronic-component handling apparatus includes a) an electronic-component retainer provided with an adhesive layer for retaining multiple electronic components by an adhesion force at the bottom surface thereof and b) a blade which is used for removing the electronic components from the adhesive layer. A driving mechanism moves the blade relative to the adhesive layer along the surface of the adhesive layer while forming a dent in the bottom surface of the adhesive layer by a tip of the blade.

10 Claims, 6 Drawing Sheets

ELECTRONIC COMPONENT HANDLING APPARATUS AND ELECTRONIC COMPONENT HANDLING METHOD

BACKGROUND OF THE INVENTION

1. Field of the Invention

The present invention relates to electronic component handling apparatuses and electronic component handling methods used in a manufacturing process of, for example, multilayer capacitors. In particular, electronic components are processed while they are being retained on a retainer by an adhesion force and are then removed from the retainer. More specifically, the present invention relates to an electronic handling apparatus and an electronic component handling method in which a process of removing the electronic components from an adhesive layer of the retainer is improved.

2. Description of the Related Art

In a manufacturing process of chip-type electronic components such as multilayer capacitors, processes for forming external electrodes, etc., are performed while the electronic chips are retained by an adhesive layer of an electronic-component retainer. Such an electronic-component retainer and an electronic-component handling method using the retainer are disclosed in Japanese Unexamined Patent Application Publication No. 4-291712. According to this publication, multiple electronic chips are adhered on an adhesive surface of an electronic-component retainer at a first end surface of the electronic chips.

Then, a conductive paste is applied to the electronic chips at a second end surface thereof and dried. The electronic chips are next adhered on an adhesive surface of another electronic-component retainer at the second end surface of the electronic chips with a stronger adhesion force. The electronic chips are then transferred to the electronic-component retainer, which is attached to the electronic chips at the second end surface thereof, and external electrodes are also formed at the first end of the electronic chips in a similar manner. The electronic chips are subsequently removed from the electronic-component retainer, which is attached to the electronic chips at the second surface thereof.

Figure 6:
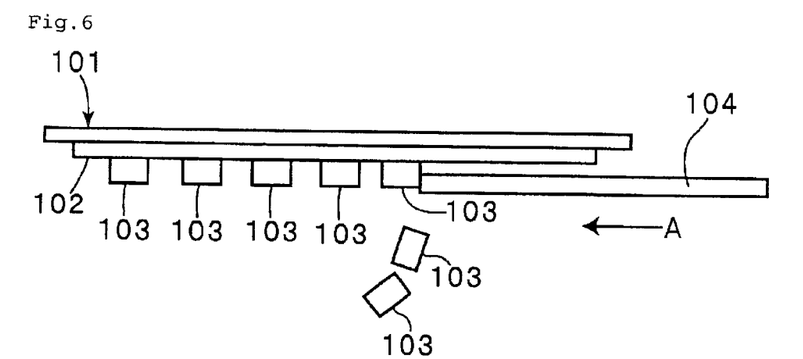
FIG. 6 is a front view showing an example of an electronic-component handling method not yet known in the art.
Figure 7:
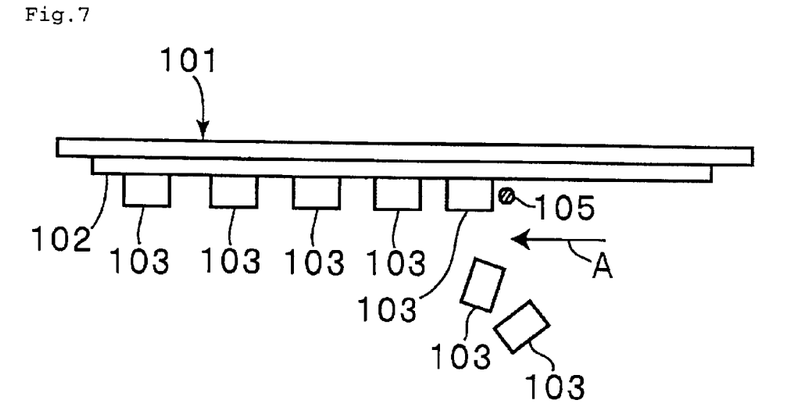
FIG. 7 is a front view showing another example of an electronic-component handling method not yet known in the art.

Although not yet known in the art, the electronic components may be removed from the adhesive surface of the above-described electronic-component retainers by methods shown in FIGS. 6 and 7.

More specifically, with reference to FIG. 6, multiple electronic components 103 are adhered on and retained by an adhesive layer 102 of an electronic-component retainer 101. A removing plate 104 moves in the direction shown by the arrow A, that is, in the direction parallel to the adhesive surface of the adhesive layer 102, so that the removing plate 104 pushes and removes the electronic components 103 from the adhesive layer 102.

In addition, with reference to FIG. 7, a wire 105 which extends perpendicularly to the page moves in the direction shown by the arrow A. That is, the wire 105 moves such that it comes into contact with the side surfaces of the electronic components 103, so that the electronic components 103 are removed from the adhesive layer 102.

In the methods shown in FIGS. 6 and 7, the removing plate 104 and the wire 105 may also be fixed while the retainer 101 moves in the direction opposite to the direction shown by the arrow A.

However, in the method shown in FIG. 6, since the removing plate 104 knocks against the side surfaces of the electronic components 103, damage to the surfaces of the electronic components 103 occurs.

In addition, since the electronic components 103 are very small, the electronic components 103 scatter when removed from the adhesive layer 102. Therefore reliable collection of all of the electronic components 103 is difficult. In addition, when a conductive paste, etc., is applied to the surface of the electronic components 103, the electronic components 103 adhere to each other if they rotate when removed from the adhesive layer 102.

Also in the method shown in FIG. 7, since the tense wire 105 knocks against the side surfaces of the electronic components 103, the external surfaces and the edges of the electronic components 103 or the external electrodes formed on the electronic components 103 may be damaged. In addition, the electronic components 103 scatter when removed from the adhesive layer 102. Therefore all of the electronic components 103 cannot be reliably collected.

SUMMARY OF THE INVENTION

In order to overcome the above-described problems, the present invention provides an electronic-component handling method and an electronic-component handling apparatus. Electronic components adhere on and are retained by an electronic-component retainer and can be removed without causing damage. Therefore, all of the removed electronic components are reliably collected. Furthermore, the electronic components do not easily adhere to each other after removal from the electronic-component retainer.

According to a first aspect of the present invention, an electronic-component handling apparatus includes an electronic-component retainer which includes a) a retaining member and an adhesive layer formed at one side of the retaining member and retains electronic components by an adhesion force; b) a blade used for removing the electronic components retained by the adhesive layer from the adhesive layer; and c) a driving source connected to the electronic-component retainer and/or the blade in order to move the blade relative to the adhesive layer along the surface of the adhesive layer while forming a dent in the adhesive layer by a tip of the blade.

According to a second aspect of the present invention, an electronic-component handling apparatus includes a) an electronic-component retainer including a retaining member and an adhesive layer formed at one side of the retaining member and retains electronic components by an adhesion force; b) a blade used for removing the electronic components retained by the adhesive layer from the adhesive layer; and c) a driving source connected to the electronic-component retainer and/or the blade in order to move a tip of the blade relative to the adhesive layer along the surface of the adhesive layer.

In the first and the second aspects of the present invention, the driving source includes a first driving mechanism which moves the blade relative to the adhesive layer in a direction perpendicular to the surface of the adhesive layer and a second driving mechanism which moves the blade relative to the adhesive layer along the surface of the adhesive layer. The first driving mechanism moves the blade perpendicularly to the surface of the adhesive layer bringing the tip of the blade into contact with the surface of the adhesive layer or a forming dent in the adhesive layer by the tip of the blade. In addition, the second driving mechanism moves the blade relative to-the adhesive layer along the surface of the adhesive layer while the tip of the blade contacts with the surface of the adhesive layer or while forming the dent in the adhesive layer by the tip of the blade.

According to a third aspect of the present invention, an electronic-component handling method, uses the electronic-component handling apparatus according to the first aspect of the present invention, includes the steps of retaining a plurality of electronic components on an adhesive layer of an electronic-component retainer by an adhesion force, the electronic-component retainer including a retaining member and the adhesive layer formed at one side of the retaining member; performing a predetermined process for the electronic components retained by the adhesive layer; and removing the electronic components from the adhesive layer by moving the blade relative to the adhesive layer along the surface of the adhesive layer while forming a dent in the adhesive layer by a tip of the blade.

According to a fourth aspect of the present invention, an electronic-component handling method using the electronic-component handling apparatus according to the second aspect of the present invention, includes the steps of retaining a plurality of electronic components having rounded edges on an adhesive layer of an electronic-component retainer by an adhesion force, the electronic-component retainer including a retaining member and the adhesive layer formed at one side of the retaining member; performing a predetermined process for the electronic components retained by the adhesive layer; and removing the electronic components from the adhesive layer by moving the blade relative to the adhesive layer along the surface of the adhesive layer while contacting a tip of the blade with the surface of the adhesive layer and inserting the tip of the blade into gaps between the electronic components and the surface of the adhesive layer.

In the electronic-component handling apparatus according to the first aspect of the present invention and the electronic-component handling method according to the third aspect of the present invention, the driving source moves the blade relative to the adhesive layer along the surface of the adhesive layer while forming a dent in the adhesive layer by the tip of the blade. Therefore, each electronic component gradually separates from the adhesive layer and is easily removed therefrom without causing damage, irrespective of the state of the edge portions of the electronic components.

In the electronic-component handling apparatus according to the second aspect of the present invention and the electronic-component handling method according to the fourth aspect of the present invention, the electronic components are retained by the adhesive layer of the electronic-component retainer, and the tip of the blade moves relative to the adhesive layer along the surface of the adhesive layer. Accordingly, the tip of the blade is inserted into the gaps between the electronic components and the adhesive layer, so that the electronic components are removed from the adhesive layer. Therefore, when the electronic components having rounded edges are to be removed from the adhesive layer as in the electronic-component handling method according to the fourth aspect of the present invention, the electronic components are easily removed from the adhesive layer without causing damage.

DESCRIPTION OF THE PREFERRED EMBODIMENTS

The present invention will be further illustrated in conjunction with preferred embodiments thereof.

Figure 1:
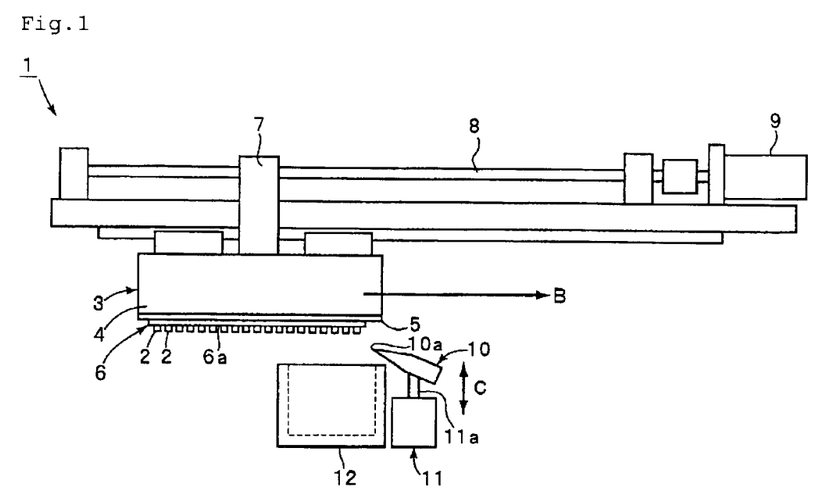
FIG. 1 is a schematic front view of an electronic-component handling apparatus according to a first embodiment of the present invention.

FIG. 1 is a schematic front view of an electronic-component handling apparatus according to a first embodiment of the present invention. With reference to FIG. 1, an electronic-component handling apparatus 1 includes an electronic-component retainer 3 for retaining multiple electronic components. The electronic-component retainer 3 includes a main body 4 embedded with an electromagnet. Although not necessary to embed the electromagnet in the main body 4, since the main body 4 of the first embodiment has the electromagnet, a retaining plate 5 formed of ferromagnetic material can be fixed on the main body 4. Material for forming the main body 4 is not particularly limited.

The bottom surface of the main body 4 fixes the retaining plate 5 by a magnetic force. The bottom surface of the retaining plate 5 has an adhesive layer 6. The main body 4 and the retaining plate 5 form a retaining member which retains the adhesive layer 6.

In the first embodiment, adhesive rubber forms the adhesive layer 6. However, the adhesive layer 6 may also be formed of other materials as long as an adhesion force has enough strength to retain electronic components at a bottom surface 6a thereof.

The bottom surface 6a of the adhesive layer 6 retains multiple electronic components 2.

In addition, the main body 4 of the electronic-component retainer 3 has a ball-screw nut unit 7 attached on a top surface thereof. The ball screw nut unit 7 has a screw hole which receives a long ball screw 8. When a motor 9 rotates the ball screw 8, the electronic-component retainer 3 moves in the direction shown by the arrow B or in the direction opposite thereto. More specifically, when the motor 9 rotates in the forward-or reverse directions, the electronic-component retainer 3 moves in the direction shown by the arrow B or in the direction opposite thereto. The ball screw 8 and the motor 9 form a second driving mechanism of the present invention.

A blade 10 is disposed below the electronic-component retainer 3. The thickness of the blade 10 decreases toward the tip 10a thereof. Although not shown in FIG. 1, the blade 10 has a plate-like shape which extends perpendicularly to the page.

Material for forming the blade 10 is not particularly limited. The blade 10 may be formed of a metal such as stainless steel, a synthetic resin such as plastic, etc. The blade 10 connects to a cylinder rod 11a of a cylinder unit 11 at an end thereof. The blade 10 moves in the direction shown by the arrow C in FIG. 1, that is, in the vertical direction, when driven by the cylinder unit 11.

The cylinder unit 11 forms a first driving mechanism of the present invention.

An electronic-component collecting container 12 is disposed below the tip 10a of the blade 10. An open top surface of the electronic-component collecting container 12 allows electronic components 2 removed from the adhesive layer 6 to fall thereto.

A description of a method for handling the electronic-components 2 using the electronic-component handling apparatus 1 follows. First, multiple electronic components 2 adhere to the bottom surface 6a of the adhesive layer 6 of the electronic-component retainer 3. In this state, a predetermined process is performed on the electronic components 2. This process is not particularly limited, and may be, for example, a process for applying a conductive paste to form an external-electrode layer as described above, a process for forming marks on the electronic components 2, etc.

Figure 2:
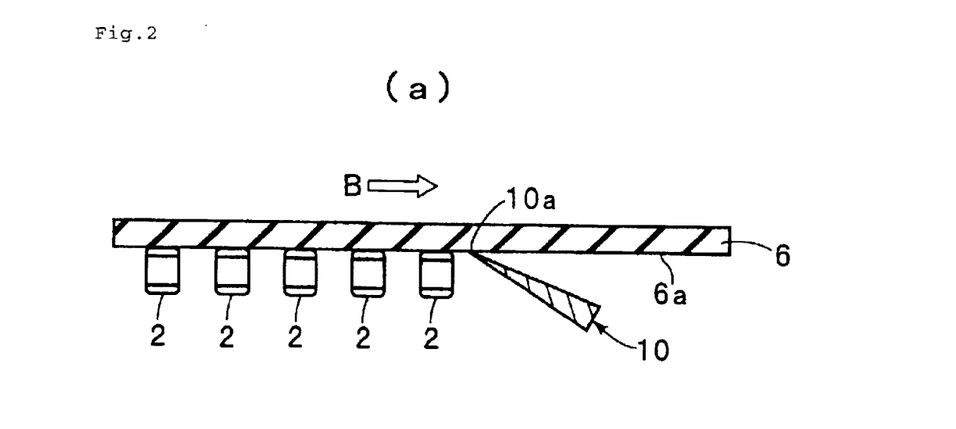
FIGS. 2A and 2B are sectional views showing a process of removing electronic components from an adhesive layer by a blade according to the first embodiment.

After performing the above-described process, the electronic components 2 retained by the adhesive layer 6 are removed from the electronic-component retainer 3 by moving the blade 10 relative to the adhesive layer 6 along the bottom surface 6a of the adhesive layer 6. In the first embodiment, first, the cylinder unit 11 drives the tip 10a of the blade 10 into contact with the bottom surface 6a of the adhesive layer 6. FIG. 2A shows an enlarged view of this state. Then, the motor 9 rotates such that the electronic-component retainer 3 moves in the direction shown by the arrow B in FIG. 1.

When the electronic components 2 have rounded edge portions as shown in FIG. 2A, as the electronic-component retainer 3 moves while the tip 10a of the blade 10 contacts with the bottom surface 6a of the adhesive layer 6, the tip 10a of the blade 10 is inserted into a gap formed between each electronic component 2 and the bottom surface 6a of the adhesive layer 6. Accordingly, the blade 10 removes the electronic components 2 from the adhesive layer 6 without damaging the electronic components 2 or the external electrodes formed thereon.

The electronic components 2 removed from the adhesive layer 6 fall into the electronic-component collecting container 12 disposed below the tip 10a of the blade 10, thereby collecting the components 2. Thus, according to the first embodiment, removal of the electronic components 2 from the adhesive layer 6 occurs without damage. Furthermore, the electronic-component collecting container 12 reliably collects all of the electronic components 2.

In the first embodiment, the blade 10 moves relative to the adhesive layer 6 along the bottom surface 6a of the adhesive layer 6 while the tip 10a of the blade 10 contacts with the bottom surface 6a of the adhesive layer 6. However, as shown in FIG. 2B, the blade 10 may also move relative to the adhesive layer 6 while forming a dent in the adhesive layer 6 by the tip 10a of the blade 10.

More specifically, during the process of driving the cylinder unit 11, the tip 10a of the blade 10 moves to a position such that the tip 10a pushes the bottom surface 6a of the adhesive layer 6 upward forming a dent 6b in the bottom surface 6a of the adhesive layer 6. In this state, the electronic-component retainer 3 moves in the direction shown by the arrow B in FIG. 1. Thus, the tip 10a of the blade 10 moves relative to the adhesive layer 6 along the bottom surface 6a of the adhesive layer 6 while forming a dent 6b in the adhesive layer 6 by the tip 10a of the blade 10. Accordingly, as shown in FIG. 3, a gap between the electronic component 2 and the bottom surface 6a of the adhesive layer 6 gradually increases, so that the electronic component 2 falls down from the bottom surface 6a of the adhesive layer 6 while barely contacting the blade 10.

Figure 4:
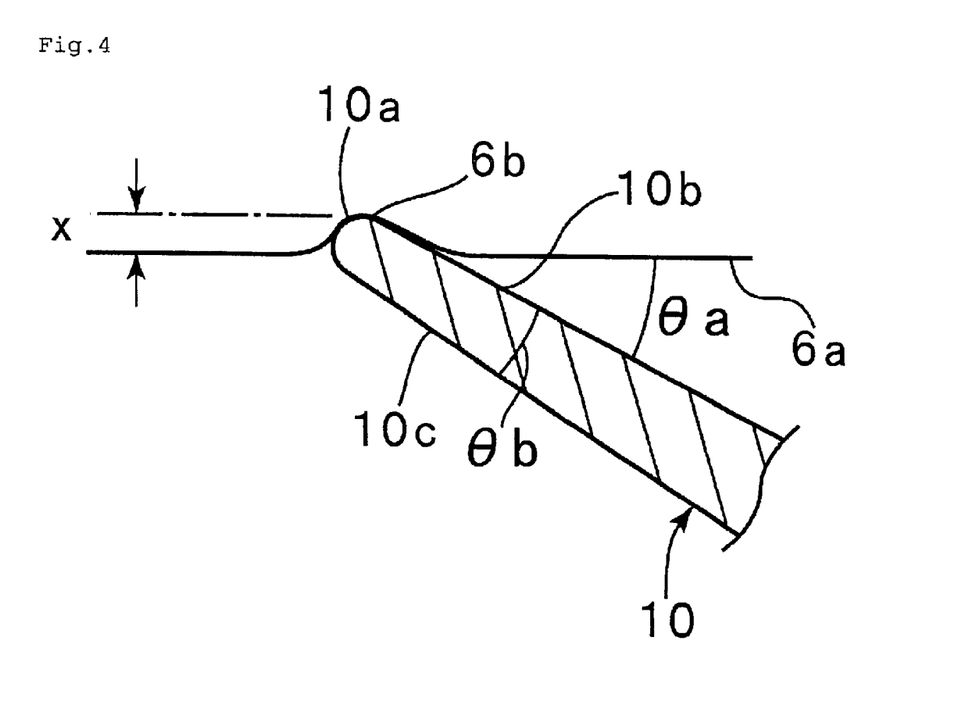
FIG. 4 is an enlarged sectional view showing a preferable construction of the blade and the adhesive layer.

Preferably, as shown in FIG. 4, an inclination angle θa of the blade 10 relative to the bottom surface 6a of the adhesive layer 6 is approximately 5°, and an angle θb between inclined surfaces 10b and 10c of the blade 10 at the tip 10a thereof is approximately 10°. In addition, when forming the dent 6b in the adhesive layer 6, the depth x of the dent 6b is preferably approximately 0.1 mm. According to this construction, the electronic components 2 are easily removed from the adhesive layer 6.

Figure 3:
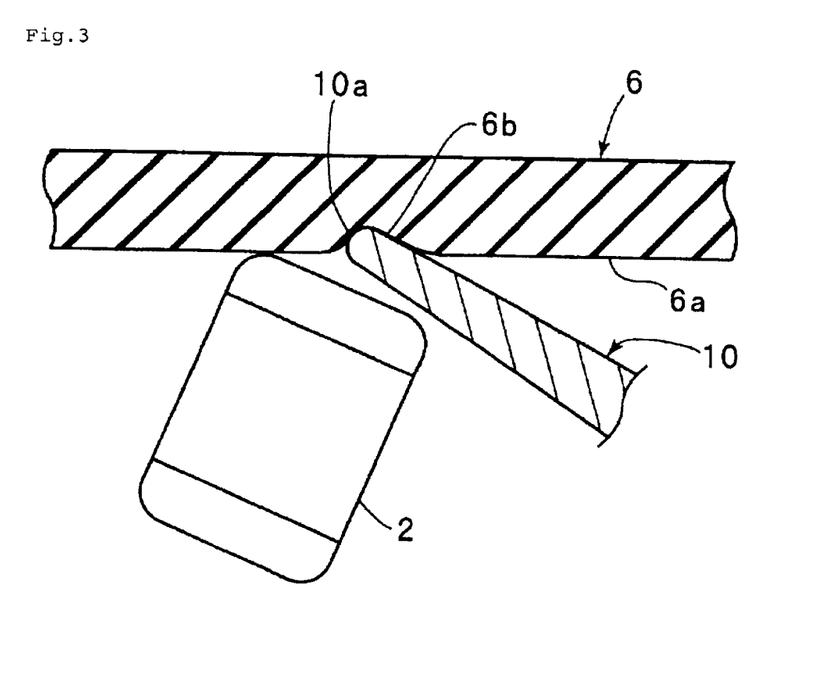
FIG. 3 is a sectional view showing a manner in which an electronic component is separated from the adhesive layer after the state shown in FIG. 2B.

In the example shown in FIGS. 2B and 3, the dent 6b formed in the bottom surface 6a of the adhesive layer 6 moves along with movement of the blade 10. Accordingly, the gap between the electronic component 2 and the bottom surface 6a of the adhesive layer 6 gradually increases until the electronic components 2 are removed from the adhesive layer 6. Accordingly, in this case, the corners of the electronic components 2 do not have to be rounded. Therefore, this construction is suitably applied to electronic components having a rectangular parallelepiped shape having non-rounded corners.

Figure 5:
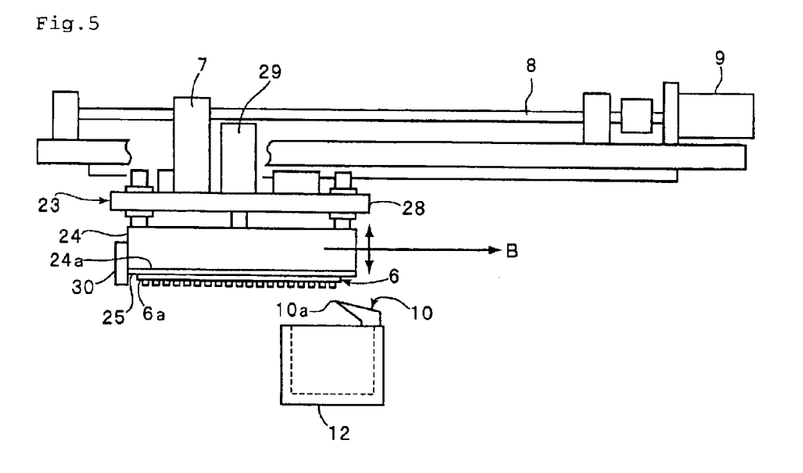
FIG. 5 is a schematic front view of an electronic-component handling apparatus according to a second embodiment of the present invention.

FIG. 5 is a schematic front view of an electronic-component handling apparatus according to a second embodiment of the present invention.

With reference to FIG. 5, an electronic-component retainer 23 includes a head 24 which serves as a retaining member. The head 24 connects to a suction source (not shown). Suction holes are formed in the bottom surface 24a of the head 24. The bottom surface 24a of the head 24 retains a retaining plate 25 by air suction using a suction source. The bottom surface of the retaining plate 25 has an adhesive layer 6 thereon.

In order to prevent the retaining plate 25 from being displaced in the horizontal direction from the head 24, a pushing member 30 is fixed to a side surface of the head 24.

A base plate 28 is disposed above the head 24. The head 24 connects to a cylinder rod of an air cylinder 29 at the bottom end of the cylinder rod. In addition, the air cylinder 29 is attached to the base plate 28. Accordingly, the head 24, the retaining plate 25, and the adhesive layer 6 moves in the vertical direction by driving the air cylinder 29. The air cylinder 29 and the base plate 28 form the first driving mechanism of the present invention. In addition, the base plate 28 has a ball-screw nut unit 7 attached at the top side thereof. Similar to the first embodiment, the ball-screw nut unit 7 moves in the direction shown by the arrow B or in the direction opposite thereto by rotating a ball screw B.

As described above, the electronic-component retainer 23 has the driving mechanism for moving the adhesive layer 6 in the vertical direction, that is, perpendicularly to the surface of the adhesive layer 6. Accordingly, in the second embodiment, the blade 10 is fixed on an electronic-component collecting container 12. A tip 10a of the blade 10 is disposed above the open surface of the electronic-component collecting container 12.

Other constructions are similar to those in the first embodiment, and similar components are denoted by the same reference numerals in order to facilitate understanding.

As is apparent from the second embodiment, in the electronic-component handling apparatus according to the present invention, the mechanism for moving the blade 10 perpendicularly to the bottom surface 6a of the adhesive layer 6 allows various modifications.

In addition, in the first and the second embodiments, the blade 10 moves relative to the adhesive layer 6 by moving the electronic-component retainer in the direction shown by the arrow B. However, the second driving mechanism may also be attached to the blade 10 and the blade 10 may be moved in the direction opposite to the direction shown by the arrow B.

Thus, according to the present invention, the first and the second driving mechanisms which move the blade perpendicularly to the surface of the adhesive layer and along the surface of the adhesive layer, respectively, may drive either one of the electronic-component retainer and the blade. In addition, the first and the second driving mechanisms may also move both of the electronic-component retainer and the blade.

It will be appreciated by those of ordinary skill in the art that the present invention can be embodied in various specific forms without departing from the spirit or essential characteristics thereof. The presently disclosed embodiments should be considered illustrative and not restrictive. The scope of the invention is indicated by the appended claims, rather than the above description. All changes that come within the meaning and range of equivalents thereof are intended to be embraced.

What is claimed is:

1. An electronic-component handling apparatus comprising:
    an electronic-component retainer including a retaining member and an adhesive layer, the adhesive layer formed on one side of the retaining member and retains electronic components by an adhesion force, wherein the adhesive layer is formed by an adhesive rubber;
    a blade for removing the electronic components from the adhesive layer; and
    a driving source which is connected to one of the electronic component retainer and the blade to move the blade relative to the adhesive layer and along a surface of the adhesive layer while forming a dent in the adhesive layer by a tip of the blade.

2. An electronic-component handling apparatus according to claim 1, wherein the driving source comprises a) a first driving mechanism moving the blade relative to the adhesive layer in a direction perpendicular to the surface of the adhesive layer and b) a second driving mechanism moving the blade relative to the adhesive layer and along the surface of the adhesive layer.

3. An electronic-component handling apparatus according to claim 2, wherein the driving source comprises a) a first driving mechanism moving the blade relative to the adhesive layer in a direction perpendicular to the surface of the adhesive layer and b) a second driving mechanism moving the blade relative to the adhesive layer and along the surface of the adhesive layer.

4. An electronic-component handling method comprising the steps of:
    retaining a plurality of electronic components on an adhesive layer of an electronic-component retainer by an adhesion force, the electronic-component retainer including a retaining member and the adhesive layer formed on one side of the retaining member;
    performing a predetermined process for the electronic components retained by the adhesive layer; and
    removing the electronic components from the adhesive layer by moving a blade relative to the adhesive layer along a surface of the adhesive layer while forming a dent in the adhesive layer by a tip of the blade.

5. An electronic-component handling method according to claim 4, wherein the adhesive layer is formed by an adhesive rubber.

6. An electronic-component handling method comprising the steps of:
    retaining a plurality of electronic components having rounded edges on an adhesive layer of an electronic component retainer by an adhesion force, the electronic component retainer including a retaining member and the adhesive layer formed on one side of the retaining member;
    performing a predetermined process for the electronic components retained by the adhesive layer; and
    removing the electronic components from the adhesive layer by moving a blade relative to the adhesive layer along a surface of the adhesive layer while contacting a tip of the blade with a surface of the adhesive layer and inserting the tip of the blade into gaps formed by the rounded edges between the electronic components and the surface of the adhesive layer.

7. An electronic-component handling apparatus comprising:
    a collection container;
    an electronic-component retainer including a retaining member and an adhesive layer, the adhesive layer formed on a bottom side of the retaining member and retains electronic components by an adhesion force;
    a blade, located beneath the electronic-component retainer, for removing the electronic components from the adhesive layer by pushing a surface of the adhesive layer upward; and
    a driving source which is connected to one of the electronic-component retainer and the blade to move the blade relative to the adhesive layer and along the surface of the adhesive layer, wherein the electronic components fall downward from the adhesive layer into the collection container.

8. An electronic-component handling apparatus according to claim 7, wherein the electronic components have rounded edge portions.

9. An electronic-component handling apparatus according to claim 8, wherein the driving source drives the tip of the blade into gaps, formed by the rounded edges, between the electronic components and the surface of the adhesive layer.

10. An electronic-component handling apparatus according to claim 7, wherein said blade forms a dent in the adhesive layer with a tip of the blade when the blade is moved relative to the adhesive layer.

* * * * *